United States Patent [19]
Frey et al.

[11] Patent Number: 5,212,457
[45] Date of Patent: May 18, 1993

[54] INPUT BUFFER WITH REDUCED OFFSET FOR OPERATIONAL AMPLIFIERS OR THE LIKE

[75] Inventors: Douglas R. Frey, Hanover Township, Northampton County; John W. Pierdomenico, West Cocalico Township, Lancaster County, both of Pa.

[73] Assignee: AT&T Bell Laboratories, Murray Hill, N.J.

[21] Appl. No.: 886,001

[22] Filed: May 19, 1992

[51] Int. Cl.[5] ............................................. H03F 3/30
[52] U.S. Cl. .................................... 330/263; 330/288
[58] Field of Search ............... 330/252, 255, 257, 263, 330/263, 288, 311, 267

[56] References Cited
U.S. PATENT DOCUMENTS 4,639,685  1/1987  Saller et al. .......................... 330/263
4,780,689  10/1988  Saller et al. .......................... 330/267
5,049,653  9/1991  Smith et al. ....................... 330/263 X

OTHER PUBLICATIONS

"Bipolar and MOS Analog Integrated Circuit Design," by Alan B. Grebene, 1984, pp. 255–261.

Primary Examiner—Steven Mottola
Attorney, Agent, or Firm—Scott W. McLellan

[57] ABSTRACT

An amplifier circuit for use as a unity gain buffer or an input stage in a current-mode feedback amplifier. As a unity gain buffer, the circuit has very low output impedance and wide dynamic range while having low offset. As an input stage, the circuit has a very low impedance inverting input and a high impedance non-inverting input with wide dynamic range and low offset. The circuit has two mirror image halves, each half having four transistors of the same polarity type and a current mirror. Each half is biased by a current source, the sources having nearly identical current.

9 Claims, 2 Drawing Sheets

INPUT BUFFER WITH REDUCED OFFSET FOR OPERATIONAL AMPLIFIERS OR THE LIKE

BACKGROUND OF THE INVENTION

1. Field of the Invention

This invention relates to amplifiers in general and, more particularly, to current-mode feedback amplifiers.

2. Description of the Prior Art

Current-mode feedback operational amplifiers are being adopted for high performance applications instead of voltage-mode feedback operational amplifiers because of the superior gain-bandwidth product and faster slew rate, as well as other advantages, of current-mode feedback amplifiers.

Current-mode feedback operational amplifiers are distinguished from voltage-mode feedback amplifiers primarily by the input stage of the amplifier having one relatively low impedance input (typically the inverting input) and relatively high impedance input (typically the non-inverting input.) Prior art exemplary input stages for a current-mode feedback amplifier are shown in U.S. Pat. No. 4,780,689. Unfortunately, the low impedance input of these prior art stages may not be sufficiently low for very high performance applications. As a consequence, the higher impedance reduces the possible gain-bandwidth product of the amplifier. Further, the prior art input stages suffer from a relatively low input dynamic range which, when used with a ground-referenced +5 volt (or lower) only supply, can be severely limiting. The amplifier should also have low input offset voltages.

Another application of the input stage for a current-mode feedback amplifier is as a unity gain buffer having a high input impedance and a low output impedance with a minimal voltage offset from input to output. Typically, the output of the buffer is the inverting low impedance input of the input stage of the current-mode feedback amplifier. The above discussed problems with impedance and the dynamic range limitations are substantially the same with the unity gain buffer as with the input stage of the current-mode feedback amplifier.

Thus, it is desirable to provide an input stage for a current-mode feedback amplifier or a unity gain buffer that has low offset, low output impedance, and large input dynamic range.

SUMMARY OF THE INVENTION

This and other aspects of the invention may be obtained generally by an amplifier having an input and an input/output terminal, characterized by: a first transistor, having a base, emitter, and a collector, the base coupling to the input of the amplifier; a second transistor, having a base, emitter, and a collector, connected as a diode and having two terminals, a first one of the two terminals coupling to the emitter of the first transistor; a third transistor, having a base, emitter, and a collector, connected as a diode and having two terminals, a first one of the two terminals coupling to a second one of the two terminals of the diode-connected second transistor; a fourth transistor, having a base, emitter, and a collector, the base connecting to a second one of the two terminals of the diode-connected third transistor, and the emitter connected to the input/output terminal; and a current source coupling to the emitter of the first transistor.

The amplifier may be utilized as a unity gain buffer or as an input stage in a current-mode feedback amplifier.

Preferably, the above circuitry is disposed in a single semiconductor substrate (a "chip").

BRIEF DESCRIPTION OF THE DRAWING

The foregoing features of this invention, as well as the invention itself, may be more fully understood from the following detailed description of the drawings, in which.

DETAILED DESCRIPTION

Figure 1:
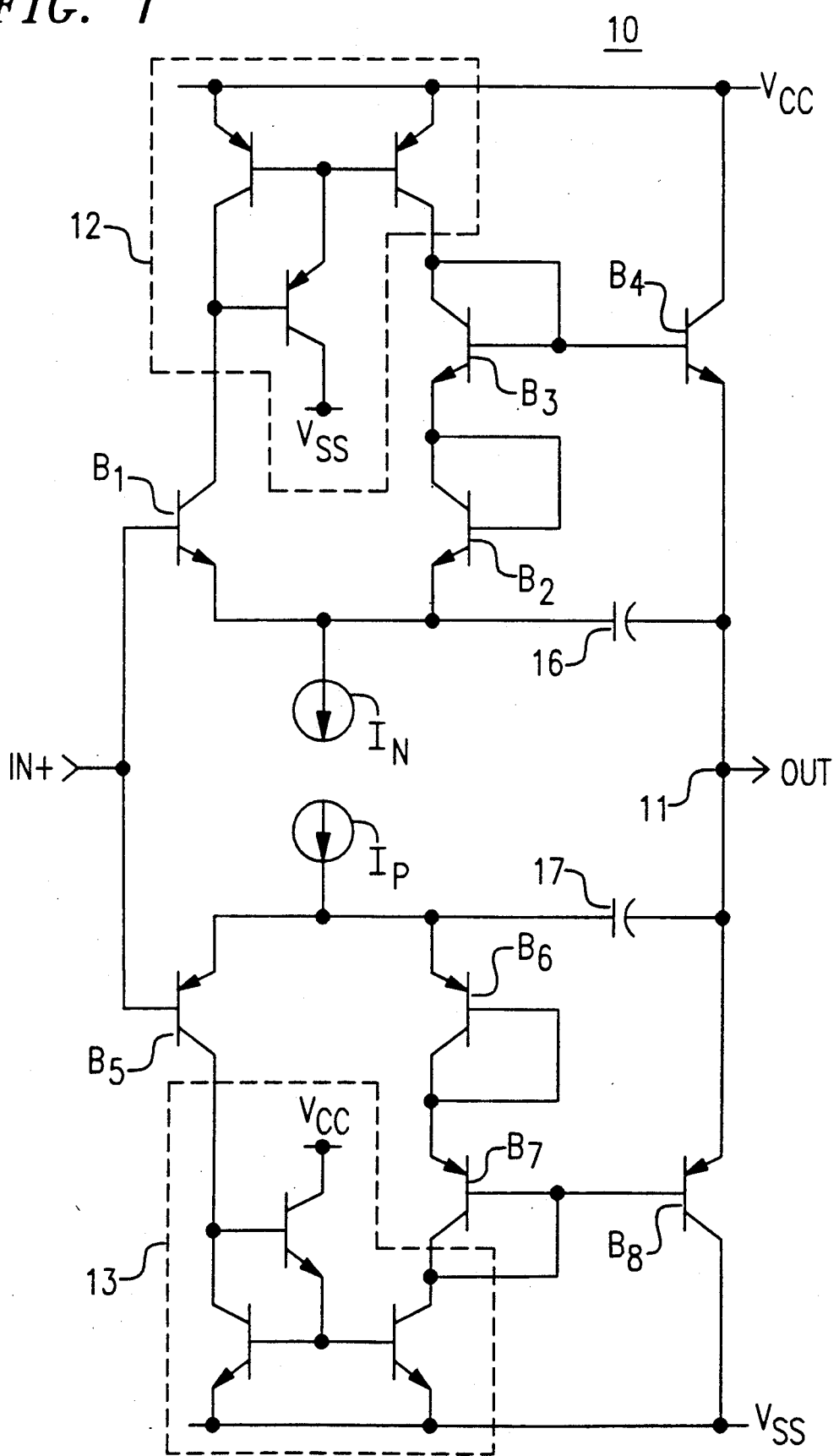
FIG. 1 is a simplified schematic diagram of a unity gain buffer or an input stage for a current-mode feedback amplifier according to one embodiment of the invention.

In FIG. 1 a unity gain buffer or input stage 10 (referred to herein as a buffer/input stage 10) for a current-mode feedback amplifier is shown in simplified schematic form. As shown, a first transistor $B_1$ has the base thereof connected to an input (IN+). The emitter of $B_1$ is connected to the emitter of a second transistor $B_2$, which is diode connected by virtue of the collector and base thereof being coupled together. In addition, a current source $I_N$ is connected to the emitter of transistor $B_1$. A third transistor $B_3$, also diode connected, has the emitter thereof connected to the collector and base of transistor $B_2$. The base of a fourth transistor $B_4$ is coupled to the collector and base of transistor $B_3$. The emitter of the transistor $B_4$ connects to an input/output terminal 11. Thus, the disclosed arrangement has a relatively low impedance at terminal 11 and wide dynamic input range measured at the input IN+ while providing low offset.

The buffer/input stage 10 also includes a current mirror 12 to enhance the accuracy of the buffer/input stage 10. As shown, the current mirror is a simple current mirror with a "helper" transistor, but other mirrors, such as a Wilson current mirror, may be used.

In addition to the above, the buffer/input stage 10 includes a "mirror image" to the above-described circuitry, comprising transistors $B_5$, $B_6$, $B_7$, and $B_8$, corresponding to transistors $B_1$, $B_2$, $B_3$, and $B_4$. Similarly, current mirror 13 corresponds to current mirror 12 and current source $I_P$ corresponds to current source $I_N$. The addition of the "mirror image" circuitry to the buffer/input stage 10 allows for the symmetrical operation of the buffer/input stage 10 for both positive going and negative going signals applied thereto.

It is preferable that the sizes of the transistors $B_1$–$B_8$ are substantially the same. Similarly, the current transfer ratio of the current mirrors 12, 13 should be substantially equal to unity. Still further, the current from current sources $I_N$, $I_P$ should be substantially the same.

To improve the speed of the buffer/input stage 10, speed-up capacitors 16, 17 may be added between the emitters of transistors $B_1$ and $B_4$ and between the emitters of transistors $B_5$ and $B_8$, correspondingly.

Figure 2:
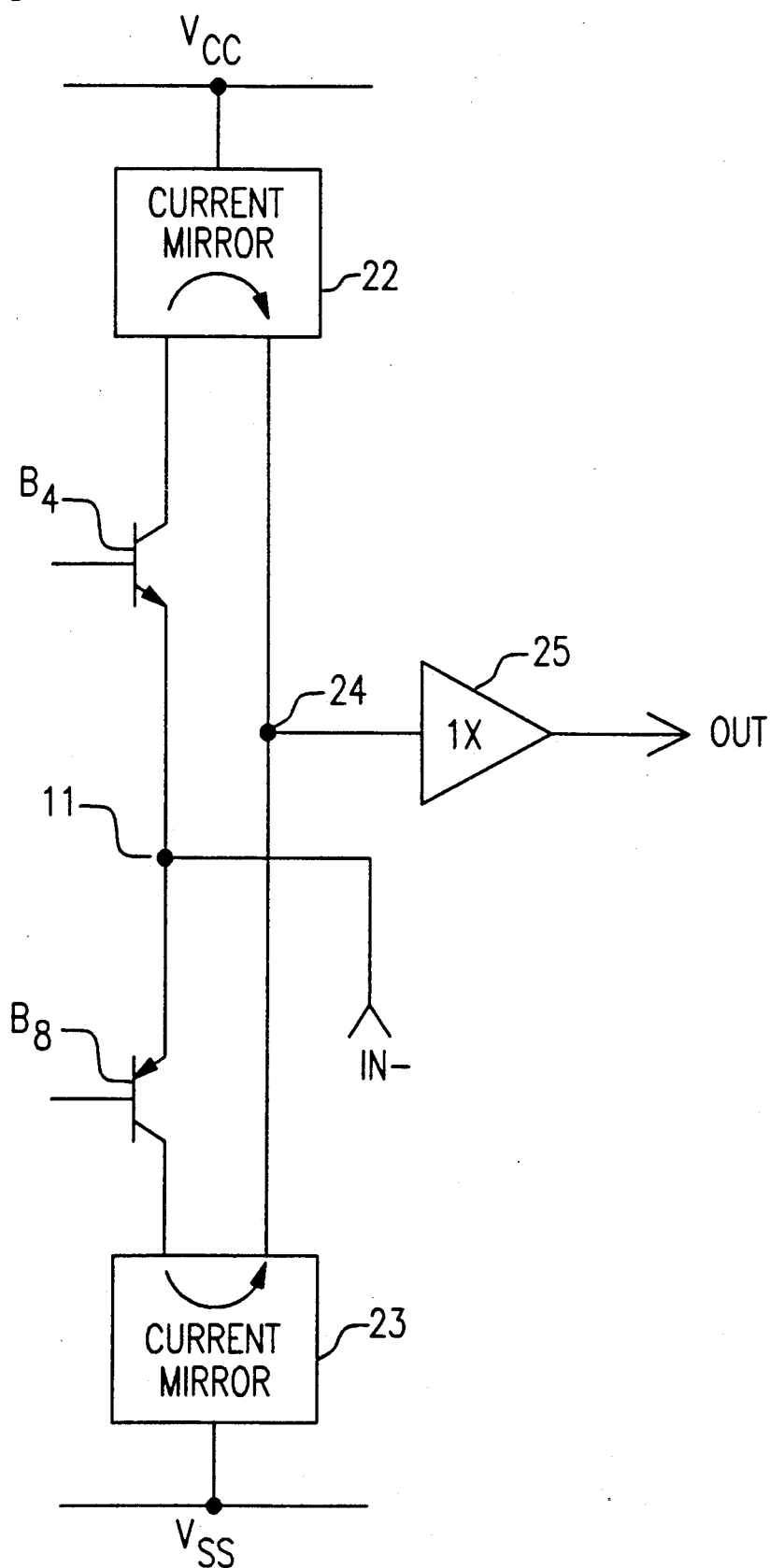
FIG. 2 is a simplified schematic diagram of an amplifier output section which, when combined with the circuit shown in FIG. 1 and in accordance with another embodiment of the invention, forms an amplifier suitable for current-mode feedback operation.

Operation of the circuitry in FIG. 1 as a unity gain buffer utilizes the terminal 11 as an output. If the circuitry is to be used as an input stage for an amplifier, terminal 11 is an input. This is shown in FIG. 2 where terminal 11 is labeled as an inverting input IN-. When used an input stage for an amplifier, the collectors of transistors B4 and B8 are coupled to the inputs of corresponding current mirrors 22, 23. The current mirrors 22, 23 form an active load for each other by the outputs thereof coupling together at node 24. Along with the input of an output stage 25 coupling to node 24, an intermediate stage (not numbered) is formed to provide the majority of the gain in the amplifier, as will be discussed below. The current mirrors 22, 23 may be similar to those shown in FIG. 1 (mirrors 12, 13). The output stage 25 may be based on many well-known designs, such as the output stage shown in FIG. 5.33 of *Bipolar and MOS Analog Integrated Circuit Design* by Alan B. Grebene, 1984, pp. 255–261, and incorporated herein by reference. It is noted that the current sources shown in FIG. 5.33 ($I_4$, $I_5$) may be varied in correspondence with the output currents of mirrors 23, 22, respectively.

The transfer ratio of the current mirrors 22, 23 should be substantially the same, preferably unity. The transimpedance gain of the intermediate stage (current mirrors 22, 23, node 24, and the input to output stage 25) is substantially determined by the load on node 24 by the output resistances of mirrors 22, 23 and by the input of output stage 25. For typical transistors found in present integrated circuit fabrication processes, the transimpedance gain is about 100 dB.

Using the circuit shown in FIG. 1 with current sources providing approximately 1 mA. each with a single +5 volt supply, the output impedance is approximately 25 ohms, the dynamic range is approximately 3.5 volts, and the offset voltage is less than 2 mV.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. In an integrated circuit, an amplifier having an input and an input/output terminal, characterized by:
    a first transistor, having a base, emitter, and a collector, the base coupling to the input of the amplifier;
    a second transistor, having a base, emitter, and a collector, connected as a diode and having two terminals, a first one of the two terminals coupling to the emitter of the first transistor;
    a third transistor, having a base, emitter, and a collector, connected as a diode and having two terminals, a first one of the two terminals coupling to a second one of the two terminals of the diode-connected second transistor;
    a fourth transistor, having a base, emitter, and a collector, the base connecting to a second one of the two terminals of the diode-connected third transistor, and the emitter connected to the input/output terminal;
    a current source coupling to the emitter of the first transistor; and
    a current mirror having an input and an output, the input coupling to the collector of the first transistor and the output coupling to the base of the fourth transistor.

2. The amplifier as recited in claim 1, wherein the diode-connected second and third transistors each have:
    the emitter connected to the first one of the two terminals thereof and the base and collector connected to the second one of the two terminals thereof.

3. The amplifier as recited in claim 2, wherein the polarity of the first, second, third, and fourth transistors are the same.

4. The amplifier as recited in claim 1, further characterized by a capacitor coupling between the emitter of the first transistor and the emitter of the fourth transistor.

5. The amplifier as recited in claim 1, further characterized by:
    a current mirror, having an input and an output, the input coupling to the collector of the fourth transistor;
    an output stage, having an input and an output, the input coupling to the output of the current mirror.

6. The amplifier as recited in claim 1, further characterized by:
    a fifth transistor, having a base, emitter, and a collector, the base coupling to the input of the amplifier;
    a sixth transistor, having a base, emitter, and a collector, the emitter connected to the emitter of the fifth transistor;
    a seventh transistor, having a base, emitter, and a collector, the emitter connected to the base and collector of the sixth transistor;
    a eighth transistor, having a base, emitter, and a collector, the base connecting to the base and collector of the seventh transistor, and the emitter connected to the input/output terminal; and
    a current source coupling to the emitter of the fifth transistor;
    wherein the polarity type of the first, second, third, and fourth transistors are of a first type and the polarity type of the fifth, sixth, seventh, and eighth transistors are a second type opposite that of the first type.

7. The amplifier as recited in claim 6, further characterized by:
    a current mirror having an input and an output, the input coupling to the collector of the fifth transistor and the output coupling to the base of the eighth transistor.

8. The amplifier as recited in claim 7, further characterized by a first capacitor coupling between the emitter of the first transistor and the emitter of the fourth transistor and a second capacitor couping between the emitter of the fifth transistor and the emitter of the eighth transistor.

9. The amplifier as recited in claim 6, further characterized by:
    a first current mirror, having an input and an output, the input coupling to the collector of the fourth transistor;
    a second current mirror, having an input and an output, the input coupling to the collector of the eighth transistor; and
    an output stage, having an input and an output, the input coupling to the outputs of the first and second current mirrors.

* * * * *